United States Patent [19]

Stanbery

[11] Patent Number: 4,795,501
[45] Date of Patent: Jan. 3, 1989

[54] SINGLE CRYSTAL, HETEROEPITAXIAL, GAALAS/CUINSE₂ TANDEM SOLAR CELL AND METHOD OF MANUFACTURE

[75] Inventor: Billy J. Stanbery, Seattle, Wash.

[73] Assignee: The Boeing Company, Seattle, Wash.

[21] Appl. No.: 72,316

[22] Filed: Jul. 13, 1987

Related U.S. Application Data

[63] Continuation-in-part of Ser. No. 792,942, Oct. 30, 1985, Pat. No. 4,680,422.

[51] Int. Cl.⁴ .................. H01L 31/06; H01L 31/18
[52] U.S. Cl. .................................... 136/249; 148/33.5; 357/30; 437/2; 437/5
[58] Field of Search ............... 136/249 TJ; 357/30 B, 357/30 J; 437/2, 5; 148/33.5

[56] References Cited

U.S. PATENT DOCUMENTS 4,536,607  8/1985  Wiesmann ............... 136/249 TJ
4,547,622  10/1985 Fan et al. ................ 136/249 TJ
4,681,982  7/1987  Yoshida ................... 136/249 TJ

OTHER PUBLICATIONS

K. Zweibel et al., *Conference Record, 18th IEEE Photovoltaic Specialists Conf.* (1985), pp. 1393-1398.
K. Zweibel, *C & E N*, p. 46, Jul. 7, 1986.
J. C. C. Fan et al., *Conference Record, 17th IEEE Photovoltaic Specialists Conf.* (1984), pp. 31-35.
J. C. C. Fan, *Solar Cells*, vol. 12, pp. 51-62 (1984).
R. W. Birkmire et al., *Proceedings, 6th E.C. Photovoltaic Solar Energy Conference* (1985), Reidel Pub. Co., pp. 270-274.
R. W. Birkmire et al., *Conference Record, 18th IEEE Photovoltaic Specialists Conf.* (1985), pp. 1413-1416.
R. P. Gale et al., *Conference Record, 18th IEEE Photovoltaic Specialists Conference* (1985), pp. 296-299.

*Primary Examiner*—Aaron Weisstuch
*Attorney, Agent, or Firm*—John C. Hammar

[57] ABSTRACT

Solar cells having high efficiency and high specific power are prepared in an "upside-down" process by depositing a lattice mismatch transition zone of $ZnS_xSe_x$ and $Cd_yZn_{1-y}S_zSe_{1-z}$ on a CLEFT, double-heterostructure, single crystal, $Ga_aAl_{1-a}As/GaAs$ thin film followed by deposition of a $CuInSe_2$ thin film on the transition zone.

54 Claims, 1 Drawing Sheet

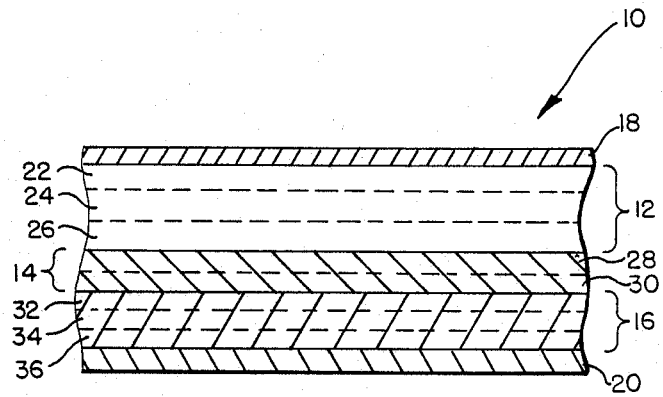

SINGLE CRYSTAL, HETEROEPITAXIAL, GAALAS/CUINSE$_2$ TANDEM SOLAR CELL AND METHOD OF MANUFACTURE

REFERENCE TO RELATED APPLICATION

The present invention is a continuation-in-part application U.S. Ser. No. 792,942, filed Oct. 30, 1985 and issued July 14, 1987, as U.S. Pat. No. 4,680,422.

TECHNICAL FIELD

The present invention relates to high efficiency, monolithic solar cells, and particularly to those having an upper cell of GaAs, GaAlAs, or both and a lower cell of CuInSe$_2$, and to its method of manufacture.

BACKGROUND ART

NASA goals for space power arrays call for specific powers for the array in excess of 300 watts/kg so that the mass and drag of the spacecraft power system will be reduced and so that the spacecraft, then, can carry larger payloads. Because the hardware of the array reduces the specific power by adding weight without increasing the power (or solar energy conversion), the cells of the array must have specific powers well in excess of 300 watts/kg if the resulting array will achieve the goal.

Mickelsen and Chen describe thin film, polycrystalline, I-II-VI$_2$ (i.e. CuInSe$_2$) semiconductors suitable for space solar cells in United States Patent Reissue No. 31,968 and U.S. Pat. No. 4,523,051 (both incorporated by reference). Their CuInSe$_2$/(Cd,Zn)S cells are deposited on relatively thick substrates selected from polycrystalline alumina, glazed alumina, enameled steel, metal foils, and similar inert inorganic materials. Typically, the substrate has a thickness of at least about 25 mils and is preferably either 25 mil alumina or 60 mil soda lime glass. Cells of this type can have efficiencies on the order of 10% AMO, but the specific power of the cells is dramatically reduced by the mass of the substrate.

Presently, silicon solar cells are used for space power applications. I-III-VI$_2$ semiconductor cells, particularly (Cd,Zn)S/CuInSe$_2$, would provide several advantages over silicon:

(1) The CuInSe$_2$ cell is generally only 10 microns thick (without substrate) and, therefore, offers the potential of an extremely high specific power. Conventional silicon cells are 50-100 times thicker.

(2) Radiation testing has shown the CuInSe$_2$ cell to be at least about 50 times more resistant to 1 MeV protons than silicon cells. The CuInSe$_2$ cell also possesses an inherent tolerance to irradiation by 1 MeV electrons up to at least $2 \times 10^{16}$ electrons/cm$^2$. At this fluence, typical silicon cells are degraded by over 50%. Because of the radiation hardness of the CuInSe$_2$ cell, reduced radiation shielding is required with CuInSe$_2$ cells which results in an even higher specific power. By using the equivalent radiation shielding on CuInSe$_2$ cells as on silicon cells, a higher end-of-life efficiency can be achieved for CuInSe$_2$ as well as a higher specific power.

(3) Annealing of the cell, after proton irradiation, at 200° C. for six minutes restores the CuInSe$_2$ cell to within 95% of its initial efficiency.

The major limiting factor against using CuInSe$_2$ cells for space applications has been a low specific power for the cells primarily caused by the substrate mass. While soda lime glass or alumina substrates are satisfactory for terrestrial applications, the cells deposited on the substrates possess a low specific power. Therefore, a much lighter substrate is required to achieve NASA's goal and to meet the demands for modern space power applications.

In U.S. Pat. No. 4,703,131, Dursch describes an improved space solar cell having a specific power in excess of 400 watts/kg and comprising a (Cd,Zn)S/CuInSe$_2$ thin film on a 2-5 mil titanium metal foil. The higher specific power results from a more efficient transducer and a much lighter substrate. Further improvements can be achieved, however, because these solar cells have conversion efficiencies of only about 8-10% AMO.

In U.S. Pat. No. 4,680,422, I describe a two-terminal, thin film, tandem solar cell comprising an upper cell of a heterojunction made from Groups II and VI elements (generally, CdSe) mechanically stacked or physically attached to a CuInSe$_2$ lower cell. Physical attachment of the CdSe upper cell is achieved through a lattice mismatch transition layer comprising a ZnSe window layer atop the lower cell and a ZnTe layer atop the ZnSe. In the mechanically stacked tandem cell, I suggest that the upper cell could be GaAs or GaAlAs, and that such thin films could be made with the CLEFT process.

Those solar cells would not achieve the maximum obtainable efficiencies or specific powers, which are so important for space applications. I now describe as part of the present invention a monolithic tandem solar cell having a potential specific power of at least about 1000 watts/kg and a conversion efficiency of about 25% AMO.

SUMMARY OF THE PRESENT INVENTION

An ultra-high-efficiency photovoltaic device (solar cell) with an extremely high specific power (power-to-mass ratio) is a monolithic, heteroepitaxial, GaAlAs/CuInSe$_2$, tandem solar cell. The solar cell has a lattice mismatch transition zone comprising an epitaxial layer of ZnS$_x$Se$_{1-x}$ adjacent the p+-minority carrier confinement layer of a Gale-type, CLEFT double heterostructure, single crystal Ga$_a$Al$_{1-a}$As upper cell followed by a Cd$_y$Zn$_{1-y}$S$_z$Se$_{1-z}$ layer adjacent the CIS lower cell. Such a cell combines an upper cell noted for its high electron mobility and high absorption coefficient with an inexpensive thin film lower cell noted for its high absorption coefficient and good electron mobility (for a p-type material). The Ga$_a$Al$_{1-a}$As has a bandgap that can be tuned by adjusting the ratio of Ga:Al over the range $1.0 \leq a \leq 0.60$ to optimize performance. The conversion efficiency of such a cell can be 25% AMO or higher with a specific power of 1000 watts/kg or higher.

BRIEF DESCRIPTION OF THE DRAWINGS

The FIGURE shows a schematic cross-section through a preferred solar cell of the present invention.

BEST MODE CONTEMPLATED FOR MAKING AND USING THE INVENTION

As shown in the FIGURE, the tandem solar cell 10 of the present invention comprises three basic elements, an upper cell 12, a lattice mismatch transition zone 14, and a lower cell 16. Each of these basic elements includes subelements, as will be explained. The completed solar cell 10 generally includes one or more antireflection coatings 18 and an electrical back contact and/or a Back Surface Reflector (BSR) and contact 20.

The upper cell 12 is preferably a CLEFT, double-heterostructure, single crystal $Ga_aAl_{1-a}As/GaAs$ thin film, wherein $1.0 \leq a \leq 0.60$. This thin film has essentially been described by R. Gale et al. of MIT at *Conf. proceedings of the 18th IEEE Photovoltaic Specialists Conf.* (IEEE, N.Y., 1985) p. 296 or in U.S. Pat. No. 4,547,622 (both incorporated by reference). The thin film comprises at least an n+-type AlGaAs region 22 (emitter), a p-type bulk GaAs or n+- type AlGaAs region (base) 24, and a p+-type AlGaAs minority carrier confinement layer or mirror 26 (buffer). An upper cell of Group III-V materials of this type has high electron mobility, a high absorption coefficient, and bandgap tunability within the compositional range from $1.0 \leq a \leq 0.60$. Its bandgap is particularly suitable for use of $CuInSe_2$ as the lower cell in a tandem solar cell. The CLEFT process described by John Fan and his colleagues and/or an analogous process to that of the referenced article may be used to prepare the upper cell, or any other suitable epitaxial technique. The upper cell may be a bulk material.

The upper cell would probably best be made with the emitter 22 adjacent to the base 24 and subsequently deposition of the minority carrier confinement layer or mirror 26, transition zone 14, and CIS lower cell 16. Such depositions should occur when the material is still adhered to and supported by a suitable, removable substrate, as will be understood by those of ordinary skill in the art. The substrate would be removed prior to front side processing (gridding and AR coating).

The upper cell 12 actually preferably has at least four active layers with other GaAs buffer or cap layers as considered necessary. An upper n+-type AlGaAs region of $Ga_{0.9}Al_{0.1}As$ forms about the first 0.035 micrometers of the emitter 22 and is graded to a $Ga_{0.63}Al_{0.37}As$ film for about 0.10 micrometers to complete the emitter 22. The bulk region 24 is about 3.0 micrometers of p-type $Ga_{0.72}Al_{0.28}As$, and the confinement layer 26 is about 0.5 micrometers of p+-type $Ga_{0.63}Al_{0.37}As$.

Unless the tandem stack is created in-situ without significant exposure to air between depositions the confinement layer 26 must be protected with a p+-type GaAs cap, that can be etched away prior to depositing the transition zone.

The lattice mismatch transition zone 14 comprises a II-VI alloy that generally includes an n+-type $ZnS_xSe_{1-x}$ epitaxial layer 28 deposited on the confinement layer 26 of the upper cell 12, wherein x is approximately 0.05. Although shown for convenience in the FIGURE as a distinct, relatively thick layer, this epitaxial layer 28 is compositionally graded over the course of depositing the transition zone 14 to an n-type $Cd_yZn_{1-y}S_zSe_{1-z}$ layer 30, where $0.10 \leq y \leq 0.90$ and z can assume any value.

Based upon composition selection solely, the transition zone 14 would be prepared from $Zn_{0.7}Cd_{0.3}Se$ or $Cd_{0.88}Zn_{0.12}S$ at the transition zone/CIS junction, thus providing an acceptable energy gap in the lattice transition. The selection, however, is much more difficult, since the success of the device 10 will be dependent upon the more important factors of interdiffusion of species at the junction during CIS deposition and the electron affinity of the II-VI alloy at the junction. Theory is lacking or misguiding for directing the optimal composition in this region of the transition zone. Success depends upon minimizing electron traps or barriers to electron injection at the junction. I prefer an ungraded, degenerately doped ZnSe layer, but those skilled in the art will be able to produce a suitable material of $Cd_yZn_{1-y}S_zSe_{1-z}$ within the desired characteristics without undue experimentation. The material selection is dependent upon, in part, the deposition technique used for the CIS lower cell 16, so more precise definition of the lower transition zone 30 is impossible.

The transition zone 14 has a total thickness of between about 0.1 to 3.0 micrometers, divided as necessary between the upper cell contact and lower cell junction. The lower cell 16 generally has a thickness of about 3.0 to 4.0 micrometers.

The solar cell 10 is completed by depositing a $CuInSe_2$ lower cell 16 onto the $Cd_yZn_{1-y}S_zSe_{1-z}$ lower transition layer 30, since the transition zone 14 has provided adequate flexibility to optimize the electron affinity.

The lower cell 16 may include three regions, as discussed by Devaney in U.S. Pat. No. 4,684,761 (incorporated by reference). That is, it can have a copper-deficient region 32 adjacent the transition zone 14, a bulk region 34 of p-type $CuInSe_2$, and a third region 36, rich in selenium, of p+-type $CuInSe_2$ for the back near contact region. The lower cell 16 should be deposited at low temperatures of around 200° C. or less to minimize the diffusion of copper into the layers 28 and 30 of the transition zone 14. The actual structure of the CIS lower cell 16, again depends upon the nature of the transition zone 14 and the method of CIS deposition. Since copper is particularly active in interdiffusion, its depletion in the transition zone/CIS junction is probably highly desirable. The CIS lower cell 16 should be made to optimize its performance in tandem with the AlGaAs upper cell.

As suggested by Devaney, the ratio of the fluxes of copper, indium, and selenium should be controlled during the reactive evaporation (i.e. deposition of the lower cell 16) to achieve the three-region lower cell. The uppermost layer 32 of the lower cell that abuts the transition zone and forms the junction generally is a thin layer deficient in copper to increase the resistivity near the junction with the transition zone. This uppermost layer forms a p-n type transient homojunction in the $CuInSe_2$, wherein the term is intended also to encompass a (p-i-n) type junction as well.

Below the uppermost layer, and forming the bulk of the lower cell, a P-type layer 34 is formed by adjusting the fluxes and their ratios. The lower cell is completed with a very thin film 36 that is rich in selenium.

The reactive evaporation can be done at low temperatures and a pressure of about $3-8 \times 10^{-6}$ torr in the presence of hydrogen to promote mixing (as described in U.S. Pat. No. 4,523,051).

While Devaney suggests temperatures between 355°–455° C., I prefer depositing the $CuInSe_2$ lower cell at lower temperatures around 300° or less to minimize diffusion of copper into the transition zone, as previously described. The deposition temperature should be held as low as possible without sacrificing the quality of the lower cell.

A metalized back contact or Back Surface Reflector 20 (generally of Mo) is deposited on the lower cell 16 to complete the solar cell 10, and may be in grid or blanket form. Because the solar cell 10 has the deposition substrate removed in the completed cell, the lower cell does not require the substrate that is conventionally used, in bottom-to-top cell manufacture, thereby greatly improving the specific power of the tandem solar cell.

Conversion efficiencies will be improved by subsequently depositing one or more antireflection coatings 18 of $TiO_2$, ZnS, SiON, or other conventional materials alone or in combination on the emitter 22 of the upper cell. Grid metalization not shown, as required, is also included.

It should be noted that the solar cell 10 is constructed in a quite unusual manner. The upper cell 12 is formed first, and is used as the substrate for deposition of the lower cell 16 of the tandem. The lattice mismatch between $Ga_aAl_{1-a}As$ and $CuInSe_2$ is accommodated through the graded $Cd_yZn_{1-y}S_zSe_{1-z}$ transition zone 14.

Solar cells of this general type may realize conversion efficiencies of 25% AMO or higher, providing for specific powers of 1000 watts/kg or more. Efficiencies of this magnitude approach the theoretical maximum for solar cells. The described cell is extremely resistant to radiation because of the inherent properties of the upper and lower cells, making the cells even more promising for space applications.

The upper cell might also be prepared from other Group III and Group V materials, including $In_{0.85}Al_{0.15}P$ or $GaAs_{0.8}P_{0.2}$, although the suitability of these upper cells in heteroepitaxial processes with II-VI alloys is not well established. The energy gaps (bandgaps) and lattice constants of the III-V alloys, however, identify them as suitable candidates for further investigation.

While preferred embodiments have been shown and described, those skilled in the art will readily recognize alterations, variations, or modifications that might be made to the particular embodiments that have described without departing from the inventive concept. For example, the upper cell may simply be a GaAs thin film or other III-V alloy. This description and the drawing are intended to illustrate the invention (and its preferred embodiments), and are not meant to limit the invention, unless such limitation is necessary in view of the pertinent prior art. Accordingly, the claims should be interpreted liberally in view of this description to protect the preferred embodiments of the invention that have been described and all reasonable equivalents. The claims should be limited only as is necessary in view of the pertinent prior art.

I claim:

1. A high efficiency tandem solar cell, comprising:
   (a) an $Ga_aAl_{1-a}As$ upper cell;
   (b) a transition zone attached to the upper cell to match the lattice structure of $Ga_aAl_{1-a}As$ to $CuInSe_2$; and
   (c) a $CuInSe_2$ lower cell.

2. The solar cell of claim 1 wherein the transition zone includes at least one II-VI alloy.

3. The solar cell of claim 2 wherein the upper cell is a double-heterostructure single crystal.

4. The solar cell of claim 2 wherein the $CuInSe_2$ lower cell is heteroepitaxially deposited on the transition zone.

5. The solar cell of claim 4 wherein the $CuInSe_2$ lower cell is p-type and comprises a first region deficient in copper, a second region forming the p-type bulk of the lower cell, and a third region rich in selenium.

6. The solar cell of claim 5 wherein the transition zone includes a first transition region of $ZnS_xSe_{1-x}$ attached to the $Ga_aAl_{1-a}As$ and a second transition region of $Cd_yZn_{1-y}S_zSe_{1-z}$ attached to the first region.

7. The solar cell of claim 6 wherein the upper cell is a double-heterostructure single crystal.

8. The solar cell of claim 7 having a specific power of at least about 1000 watts/kg.

9. The solar cell of claim 8 wherein x in $ZnS_xSe_{1-x}$ is approximately equal to 0.05.

10. The solar cell of claim 9 wherein for $Ga_aAl_{1-a}As$, $1.0 \leq a \leq 0.6$.

11. The solar cell of claim 10 wherein, for $Cd_yZn_{1-y}S_zSe_{1-z}$, $0 \leq y \leq 0.90$.

12. The solar cell of claim 11 wherein $y = z = 0$ so that the material is ZnSe.

13. The solar cell of claim 12 wherein the ZnSe is degenerately doped.

14. The solar cell of claim 5 wherein the upper cell is a double-heterostructure single crystal.

15. The solar cell of claim 1 wherein the transition zone includes a first II-VI alloy forming an upper junction with the upper cell and a second II-VI alloy forming a lower junction with the lower cell.

16. The solar cell of claim 1 wherein the transition zone includes a first region of $ZnS_xSe_{1-x}$ attached to the upper cell and a second region of $Cd_yZn_{1-y}S_zSe_{1-z}$ attached to the first region and the lower cell.

17. The solar cell of claim 1 wherein the upper cell includes a double-heterostructure.

18. The solar cell of claim 17 wherein the upper cell is a single crystal.

19. The solar cell of claim 18 wherein the upper cell is formed by the CLEFT process.

20. The solar cell of claim 18 wherein the transition zone includes a first region of $ZnS_xSe_{1-x}$ attached to the upper cell and a second region of $Cd_yZn_{1-y}S_zSe_{1-z}$ attached to the first region.

21. The solar cell of claim 1 wherein the $CuInSe_2$ lower cell is p-type and comprises a first region deficient in copper, a second region comprising the p-type bulk of the lower cell, and a third region rich in selenium.

22. A method for making a high efficiency tandem solar cell comprising the steps of:
   (a) forming an upper thin film of $Ga_aAl_{1-a}As$;
   (b) depositing $Cd_yZn_{1-y}S_zSe_{1-z}$ on the upper thin film; and
   (c) depositing a lower thin film of $CuInSe_2$ on the $Cd_yZn_{1-y}S_xSe_{1-x}$.

23. The method of claim 22 wherein step (b) includes the substeps of depositing a first layer of $ZnS_zSe_{1-z}$ on the upper thin film and grading the composition from $ZnS_zSe_{1-z}$ to $Cd_yZn_{1-y}S_zSe_{1-z}$, wherein $0 \leq y \leq 0.90$.

24. The method of claim 22 wherein the step of forming the upper thin film includes the substep of forming a double heterostructure.

25. The method of claim 24 wherein the step of depositing the lower thin film includes the substeps of depositing a copper-deficient $CuInSe_2$ region on the $Cd_yZn_{1-y}S_zSe_{1-z}$, grading the $CuInSe_2$ to a bulk region, and grading the bulk region to a selenium-rich $CuInSe_2$ region.

26. The method of claim 25 further comprising the step of depositing a back surface reflector on the selenium-rich $CuInSe_2$ region.

27. The product of the process of claim 26.

28. A method for making a monolithic, single crystal, tandem solar cell comprising the steps of:

(a) making a single crystal upper thin film cell of a III-V alloy;
(b) heteroepitaxially depositing a lower thin cell of a I-III-VI$_2$ alloy on the upper thin film cell; and
(c) depositing a back contact on the lower thin film cell 29. The method of claim 28 wherein making the upper thin film cell includes depositing Ga, Al, and As and depositing the lower thin film cell includes depositing Cu, In, and Se.

30. The method of claim 29 further comprising the step of heteroepitaxially depositing a lattice mismatch transition zone between the upper cell and the lower cell.

31. The method of claim 30 wherein the lower cell is deposited at low temperatures to minimize the diffusion of copper into the transition zone.

32. A method for making a solar cell comprising the steps of:
(a) making an upper thin film cell of a III-V alloy;
(b) depositing a lattice mismatch transition zone of at least one II-VI alloy on the III-V upper cell;
(c) depositing a lower thin film of a I-III-VI$_2$ alloy on the transition zone; and
(d) depositing a back contact on the lower thin film.

33. The method of claim 32 wherein the transition zone includes a graded $Zn_yCd_{1-y}S_zSe_{1-z}$ layer.

34. The method of claim 32 wherein the step of making the upper thin film cell includes preparing a double-heterostructure, single crystal, AlGaAs cell.

35. The method of claim 34 wherein the upper cell is made by the CLEFT process.

36. The method of claim 34 further comprising the step of applying at least one antireflection coating to the upper cell.

37. The method of claim 32 wherein the step of making the upper thin film includes epitaxially forming the upper thin film on a removable substrate and wherein the method further includes the step of removing the substrate from the upper thin film.

38. The product of the process of claim 32.

39. A method for making a high efficiency tandem cell having a high specific power, comprising the steps of:
(a) making a double-heterostructure, single crystal, thin film, upper cell including $Ga_aAl_{1-a}As$, wherein $1.0 \leq a \leq 0.60$;
(b) depositing a graded $Cd_yZn_{1-y}S_zSe_{1-z}$ thin film transition zone on the upper cell, beginning with a layer of $ZnS_{0.05}Se_{0.95}$; and
(c) depositing a lower cell of CuInSe$_2$ on the transition zone.

40. The method of claim 39 wherein the deposition of step (c) is done at low temperatures to minimize the diffusion of copper into the transition zone.

41. The method of claim 39 wherein the upper cell is made according to the method of Gale, so that the upper cell has an n+-type first region, a p-type bulk region, and a p+-type minority carrier region.

42. The method of claim 39 wherein the CuInSe$_2$ includes a copper-deficient region adjacent the transition zone, a bulk region, and a selenium-rich region.

43. The method of claim 39 further comprising depositing a back surface reflector and contact onto the lower cell.

44. The method of claim 43 further comprising applying an antireflection coating onto the upper cell.

45. The product of the process of claim 44.

46. A method for making a high efficiency, tandem solar cell having a high specific power, comprising the steps of:
(a) making a double-heterostructure, single crystal $Ga_aAl_{1-a}As$ upper cell including an n+-type first AlGaAs layer, a p-type bulk layer adjacent the first layer, and a p+-type AlGaAs minority carrier mirror on the bulk layer, wherein $1.0 \leq a \leq 0.60$;
(b) depositing a lattice mismatch transition zone on the p+-type minority carrier by initially depositing a $ZnS_{0.05}Se_{0.95}$ thin film and grading the composition subsequently to $Cd_yZn_{1-y}S_zSe_{1-z}$ wherein $0 \leq y \leq 0.90$ and z may assume any value between 0 and 1.0;
(c) depositing CuInSe$_2$ thin film on the transition zone at low temperature to minimize the diffusion of copper into the transition zone;
(d) depositing a back surface reflector and contact on the CuInSe$_2$ thin film; and
(e) depositing at least one antireflection coating on the n+-type first layer of the upper cell.

47. The method of claim 46 further comprising the step of separating the upper cell from a substrate after steps (b) and (c).

48. The product of the process of claim 47.

49. The method of claim 46 wherein making the upper cell uses the CLEFT process.

50. The method of claim 46 wherein the CuInSe$_2$ thin film is a graded film having a copper-deficient region adjacent the transition zone and a selenium-rich region adjacent the back surface reflector.

51. The product of the process of claim 46.

52. The product of the process of claim 49.

53. A high efficiency tandem solar cell, comprising:
(a) an upper cell comprising at least one III-V alloy,
(b) a lattice mismatch transition zone comprising at least two II-VI alloys, one alloy attached to the upper cell by a heteroepitaxial technique,
(c) a lower cell comprising at least one I-III-VI$_2$ alloy attached to the transition zone,
(d) a back surface reflector attached to the lower cell, and
(e) at least one antireflection coating attached to the upper cell.

54. An intermediate useful in preparing high efficiency tandem, heteroepitaxial photovoltaic devices, comprising:
(a) a substrate,
(b) a III-V alloy removably deposited by an epitaxial technique on the substrate,
(c) a lattice mismatch transition zone deposited on the III-V alloy, and
(d) a second photoactive semiconductor alloy having a different lattice constant from the III-V alloy deposited on the transition zone by a heteroepitaxial technique.

* * * * *